(12) United States Patent
Yang et al.

(10) Patent No.: US 11,828,448 B2
(45) Date of Patent: Nov. 28, 2023

(54) HARSH AND HAZARDOUS LOCATION LIGHT-EMITTING DIODE MODULE, LUMINAIRE ASSEMBLY, AND METHOD

(71) Applicant: EATON INTELLIGENT POWER LIMITED, Dublin (IE)

(72) Inventors: Yang Yang, Shanghai (CN); Peihuan Liu, Shanghai (CN); Yuru Li, Shanghai (CN)

(73) Assignee: Eaton Intelligent Power Limited, Dublin (IE)

( * ) Notice: Subject to any disclaimer, the term of this patent is extended or adjusted under 35 U.S.C. 154(b) by 0 days.

(21) Appl. No.: 17/731,731

(22) Filed: Apr. 28, 2022

(65) Prior Publication Data

US 2022/0349568 A1    Nov. 3, 2022

(30) Foreign Application Priority Data

Apr. 30, 2021   (CN) .......................... 202120937446.2

(51) Int. Cl.
| | |
|---|---|
| F21V 31/00 | (2006.01) |
| F21V 29/70 | (2015.01) |
| F21K 9/60 | (2016.01) |
| F21V 25/12 | (2006.01) |
| H01L 27/15 | (2006.01) |
| H01L 33/48 | (2010.01) |

(52) U.S. Cl.
CPC .............. *F21V 31/005* (2013.01); *F21K 9/60* (2016.08); *F21V 25/12* (2013.01); *F21V 29/70* (2015.01); *H01L 27/153* (2013.01); *H01L 33/483* (2013.01)

(58) Field of Classification Search
None
See application file for complete search history.

(56) References Cited

U.S. PATENT DOCUMENTS

2018/0135846 A1    5/2018   Chen

FOREIGN PATENT DOCUMENTS

| CN | 203082721 U | | 7/2013 |
|---|---|---|---|
| CN | 205991335 U | * | 3/2017 |
| DE | 102018004049 A1 | | 11/2019 |
| EP | 3425263 A1 | | 1/2019 |
| KR | 101885627 B1 | * | 9/2018 |
| WO | WO 2016124385 A1 | | 8/2016 |

OTHER PUBLICATIONS

EESR received for EP Application No. EP22170153.5-1201, 9 pages, Oct. 4, 2022.

* cited by examiner

*Primary Examiner* — Elmito Breval
(74) *Attorney, Agent, or Firm* — Baker Botts L.L.P.

(57) ABSTRACT

A light-emitting diode (LED) module of an LED luminaire assembly for a harsh and hazardous environment is provided. The LED module includes an LED assembly, a single-piece lens assembly, and an adhesive sealant. The LED assembly includes a plurality of LEDs. The single-piece lens assembly includes a plurality of lenses, wherein the lens assembly includes a groove defining a complete loop and surrounding the plurality of lenses, the lens assembly coupled to the LED assembly, and the plurality of lenses covering at least one of the plurality of LEDs. The adhesive sealant is disposed in the groove and bonded to the lens assembly, the adhesive sealant sealing off the plurality of LEDs from an ambient environment around the LED module.

20 Claims, 6 Drawing Sheets

HARSH AND HAZARDOUS LOCATION LIGHT-EMITTING DIODE MODULE, LUMINAIRE ASSEMBLY, AND METHOD

CROSS REFERENCE TO RELATED APPLICATIONS

This patent application claims the benefit and priority of Chinese Utility Model Application No. 202120937446.2 filed on Apr. 30, 2021, the disclosure of which is incorporated by reference herein in its entirety as part of the present application.

BACKGROUND OF THE DISCLOSURE

The field of the disclosure relates generally to luminaire assemblies, and more particularly to assemblies and methods for light-emitting diode (LED) modules and LED luminaire assemblies located in a harsh and/or hazardous environment.

To address the shortcomings of incandescent bulbs in traditional lighting fixtures, more energy-efficient and longer lasting sources of illumination in the form of LEDs in a LED module are highly desired. This includes, but is not limited to lighting fixtures that are specially designed for use in harsh and/or hazardous environments that require a specific focus on explosion proof in the operation of the lighting fixtures. In hazardous or harsh industrial environments, such as mines, refineries, and petroleum chemical plants, gas, vapors, dust, or other flammable substances are present in the ambient environment. In such harsh and hazardous environments, LED module(s) and luminaire assemblies must be carefully constructed to withstand severe operation conditions, prevent possible ignition of combustive substances in the ambient environment and/or be constructed to ensure that corrosive elements in the ambient environment may not reach sensitive internal components.

Known LED modules and luminaire assemblies are disadvantaged in some aspects and improvements are desired.

BRIEF DESCRIPTION OF THE DRAWINGS

Non-limiting and non-exhaustive embodiments are described with reference to the following Figures, wherein like reference numerals refer to like parts throughout the various drawings unless otherwise specified.

DETAILED DESCRIPTION

Figure 1:
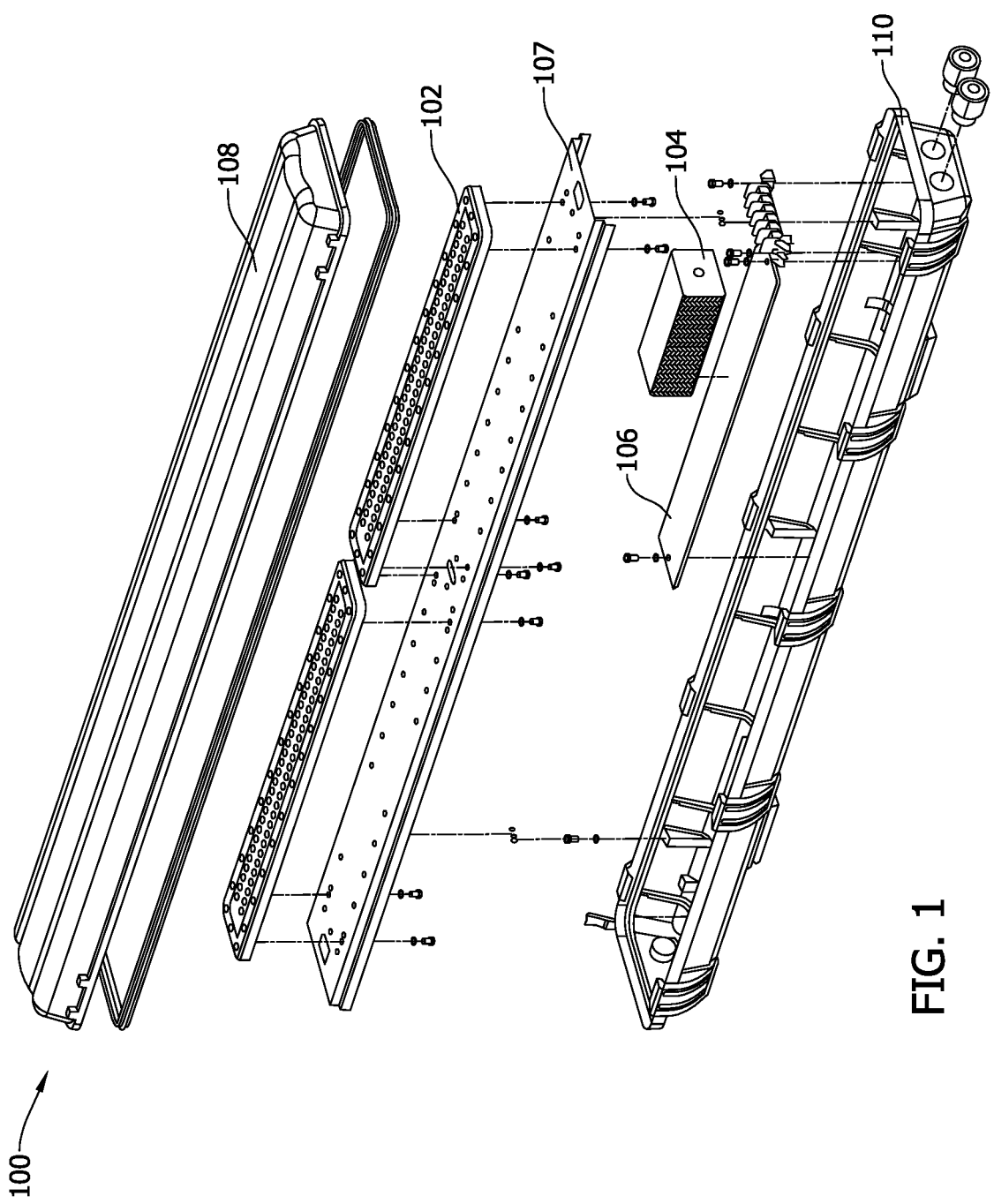
FIG. 1 is an exploded view of an exemplary luminaire assembly.

In order to understand the inventive concepts described herein to their fullest extent, some discussion of the state of the art and certain problems and disadvantages concerning LED light fixtures is set forth below, followed by exemplary embodiments of luminaire assemblies and light-emitting diode (LED) modules overcoming such problems and disadvantages in the art.

Various types of lighting fixtures utilizing LEDs have been developed for numerous types of commercial and industrial environments. More specifically, LED light fixtures have been developed for lighting tasks in harsh and hazardous environments, such as being designed to be explosion-protected.

Luminaire assemblies that operate within hazardous environments present a risk of explosion via ignition of a surrounding gas or vapor dusts, fibers, or flyings. Such hazardous environments may arise, for example only, in petroleum refineries, petrochemical plants, grain silos, waste water and/or treatment facilities among other industrial facilities, wherein volatile conditions are produced in the ambient environment and present a heightened risk of fire or explosion. An occasional or continuous presence of airborne ignitable gas, ignitable vapors or ignitable dust, or otherwise flammable substances presents substantial concerns regarding safe and reliable operation of such facilities overall, including, but not limited to, safe operation of the lighting fixtures such as containing sparks within the lighting fixtures to prevent possible fire or explosion. As such, a number of standards have been promulgated relating to electrical product use in explosive environments to improve safety in hazardous locations in view of an assessed probability of explosion or fire risk.

For example, Underwriter's Laboratories ("UL") standard UL 1203 sets forth Explosion-Proof and Dust-Ignition-Proof Electrical Equipment criteria for hazardous locations. Electrical equipment manufacturers may receive UL certification of compliance with the applicable rating standards for hazardous locations, and UL certification is an important aspect of a manufacturer's ability to successfully bring products to market in North America or any other market accepting of UL standard 1203.

The National Electric Code (NEC) generally classifies hazardous locations by class and division. Class 1 locations are those in which flammable vapors and gases may be present. Class II locations are those in which combustible dust may be found. Class III locations are those which are hazardous because of the presence of easily ignitable fibers or flyings. Considering Class 1, Division 1 covers locations where flammable gases or vapors may exist under normal operating conditions, under frequent repair or maintenance operations, or where breakdown or faulty operation of process equipment might also cause simultaneous failure of electrical equipment. Division 1 presents a greater risk of explosion than, for example, Division 2 where flammable gases or vapors are normally handled either in a closed system, confined within suitable enclosures, or are normally prevented by positive mechanical ventilation.

The International Electrotechnical Commission (IEC) likewise categorizes hazardous locations into Class I, Zone 0, 1, or 2 representing locations in which flammable gases or vapors are or may be airborne in an amount sufficient to produce explosive or ignitable mixtures. As defined in the IEC, a Class I, Zone 0 location is a location in which ignitable concentrations of flammable gases or vapors are present continuously or for long periods of time. A Class I, Zone 1 location is a location in which ignitable concentrations of flammable gases or vapors are likely to exist because of repair or maintenance operations or because of leakage or possible release of ignitable concentrations of flammable gases or vapors, or is a location that is adjacent to a Class I, Zone 0 location from which ignitable concentrations of vapors could be communicated.

While expressed a bit differently, IEC Zone 1 and NEC Division 2, in practice, generally converge to common locations in the assessment of hazardous environments. In view of modern environmental regulation and the concentrated nature of Division 1 and Zone 0 applications, any lighting fixtures installed in such hazardous locations must reliably contain sparks in the luminaire assembly from the surrounding atmosphere. As such, conventional LED lighting fixtures for hazardous locations include more extensive sealing features for containing hazards than other types of lighting fixtures, complicating the lighting fixture assembly and rendering the cost of hazardous location LED lighting fixtures undesirably high.

In addition to hazardous locations discussed above, so-called harsh locations also require specific focus in the design of light fixtures used therewith. Harsh locations may entail corrosive elements and the like in the atmosphere that are not necessarily explosive and/or are subject to temperature cycling, pressure cycling, shock and/or mechanical vibration forces that are typically not present in non-harsh operating environments. Of course, some locations in which LED lighting fixtures are desirably employed are both harsh and hazardous by nature, and are therefore heavy duty fixtures designed to withstand various operating conditions that typical lighting features for other uses could not withstand.

Simpler, more reliable, more cost-effective LED luminaire assemblies for harsh and/or hazardous environments, which are simpler and cheaper to manufacture, are therefore desired.

The assemblies and methods disclosed herein accordingly provide luminaire assemblies and LED modules meeting the requirements for harsh and/or hazardous environments, as well as being more reliable and cheaper than existing LED light fixtures of the same lumen rating. Method aspects will be in part apparent and in part explicitly discussed in the following description.

FIG. 1 is an exploded view of an exemplary luminaire assembly 100 that includes an exemplary LED module 102. The luminaire assembly 100 is rated to be operated in a harsh and/or hazardous environment as discussed above. The luminaire assembly 100 is an LED luminaire assembly, and includes the LED module 102. The luminaire assembly 100 further includes a driver 104, which provides electricity to drive the LEDs in the LED module 102. The luminaire assembly 100 includes a driver heat sink 106. In some embodiments, the luminaire assembly 100 further includes a reflector 107 that reflects light emitted from the LED towards a desired direction. The luminaire assembly 100 includes a first cover 108 and a second cover 110 sized to receive the LED module 102, the driver 104, the driver heat sink 106, and other components of the luminaire assembly 100 such as the reflector 107 therein.

Figure 2A:
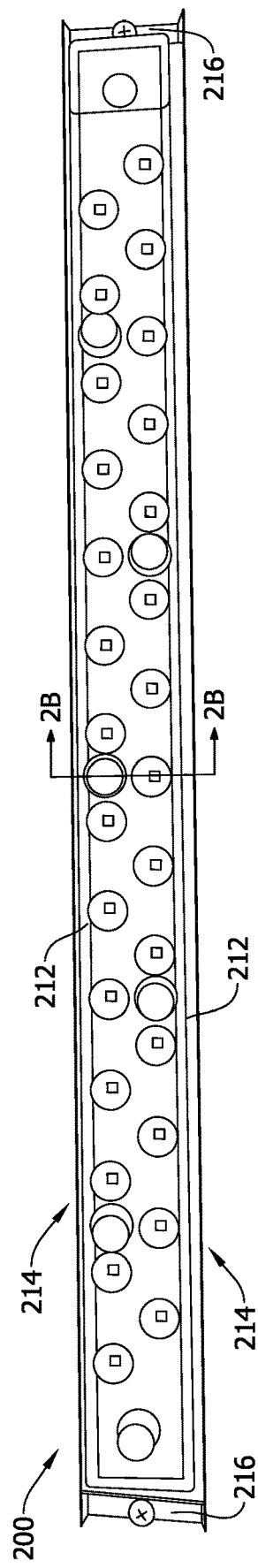
FIG. 2A is a perspective view of a known light-emitting diode (LED) module.
Figure 2B:
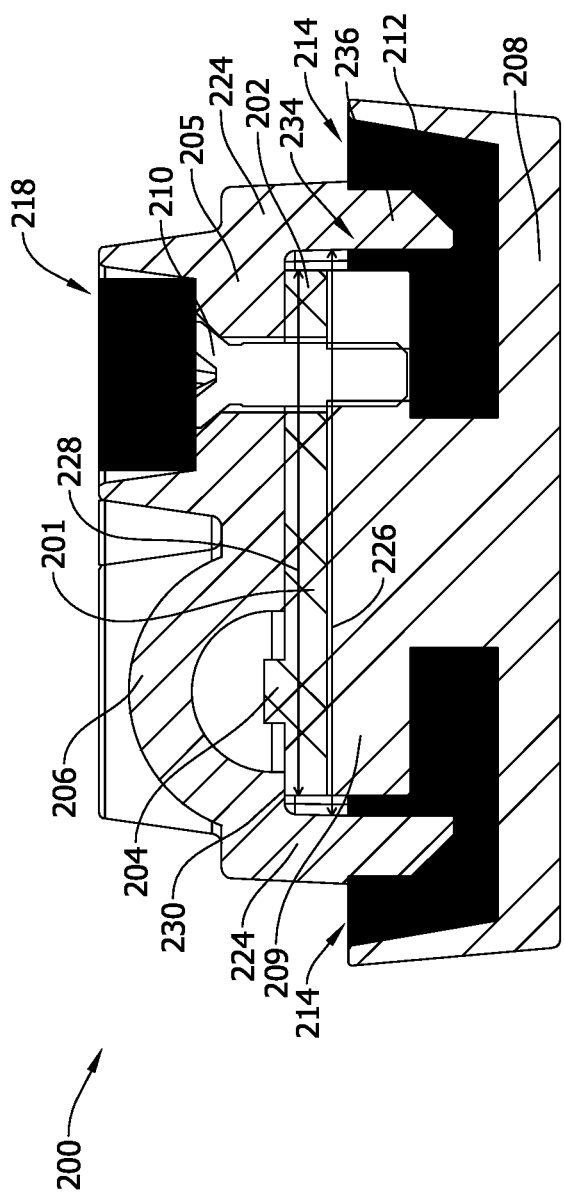
FIG. 2B is a cross-sectional view of the LED module shown in FIG. 2A along line 2B-2B.

FIGS. 2A and 2B show a known LED module 200. FIG. 2A is a perspective view of the LED module 200. FIG. 2B is a cross-sectional view of the LED module 200 along a cross-sectional line 2B-2B. The LED module 200 includes an LED assembly 201 having a print circuit board (PCB) 202 and a plurality of LEDs 204 positioned on the PCB 202. The LED module 200 further includes a lens assembly 205 having a plurality of lenses 206, a heat sink 208, and a fastener 210. The lenses 206 cover one or more LEDs 204. Light emitted from the LEDs 204 passes through the lenses and out of the LED module. The lens assembly 205 may be fabricated as a single-piece (i.e., only one piece) from suitable plastic materials. The lens assembly 205 further includes two side walls 224. The spacing 226 between the two side walls 224 is slightly greater than a width 228 of the PCB 202 such that when the lens assembly 205 is placed over the PCB 202, the side walls 224 arch around a peripheral rim 230 of the PCB 202.

The heat sink 208 is fabricated from aluminum according to a known extrusion process. Because of the extrusion process, the heat sink 208 has the same profile in the longitudinal direction, such as a rectangular outer profile. The heat sink 208 also is shaped with an island 209. The cross section of the heat sink 208 is a T-shape such that the heat sink 208 forms two channels 214 and the amount of aluminum is reduced.

To assemble the LED module 200, the lens assembly 205 is placed over the PCB 202 with the lenses 206 covering the LEDs 204 and with ends 236 of the side walls 224 are positioned in the channels 214. The fastener 210 is placed through apertures formed in the lens assembly 205, the PCB 202, and the heat sink 208, fastening the lens assembly 205, the PCB 202, and the heat sink 208 together. To meet the standards for a harsh and hazardous environment, for example standard IEC 60079-18, an adhesive 212 is applied to seal the LEDs 204 and the lenses 206 to prevent exterior sparks or other possible ignition sources from reaching a combustible atmosphere and so that corrosive substances do not enter into the interior of the LED module. The adhesive 212 is applied in the channel 214 and above the fastener 210. The adhesive 212 should fill the channel 214 including the inner channel 232 of the channel 214 that is below the fastener and a gap 234 of the channel 214 that is between the heat sink 208 and the side wall 224 of the lens assembly 205. In the LED module 200, two end caps 216 (FIG. 2A) are needed to prevent the adhesive 212 from flowing out of the channel 214 and affecting the seal of the LED module 102, because the heat sink 208 does not form an end cap at the end of the channels 214 due to the extrusion process.

The LED module 102 disclosed herein lowers the cost of raw material and assembling processes, in the meantime maintaining or increasing the quality of the LED module 102, compared to the known LED module 102. Unlike a typical approach where to reduce costs, less amount of material or cheaper material is used while the quality, performance, and/or reliability of the apparatus is compromised, the LED module 102 disclosed herein is more reliable than the known LED module 200.

Figure 3A:
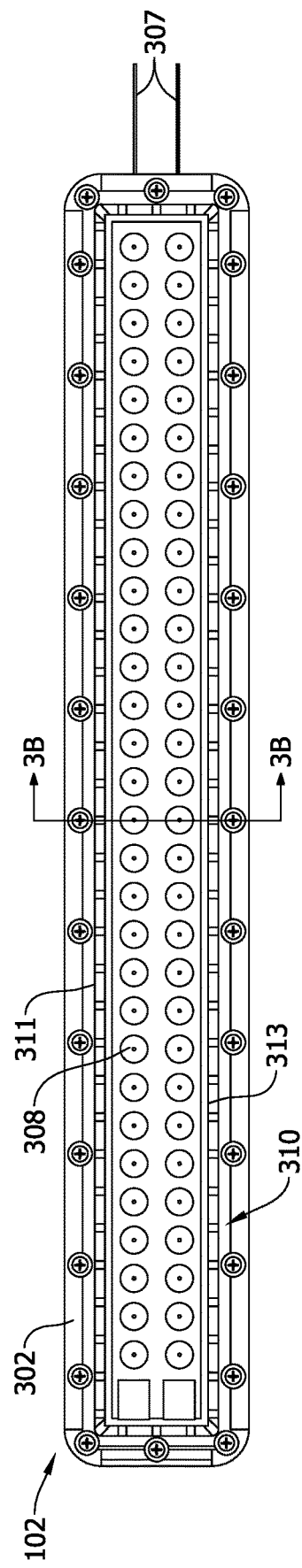
FIG. 3A is a top view of an exemplary LED module in the luminaire assembly shown in FIG. 1.
Figure 3B:
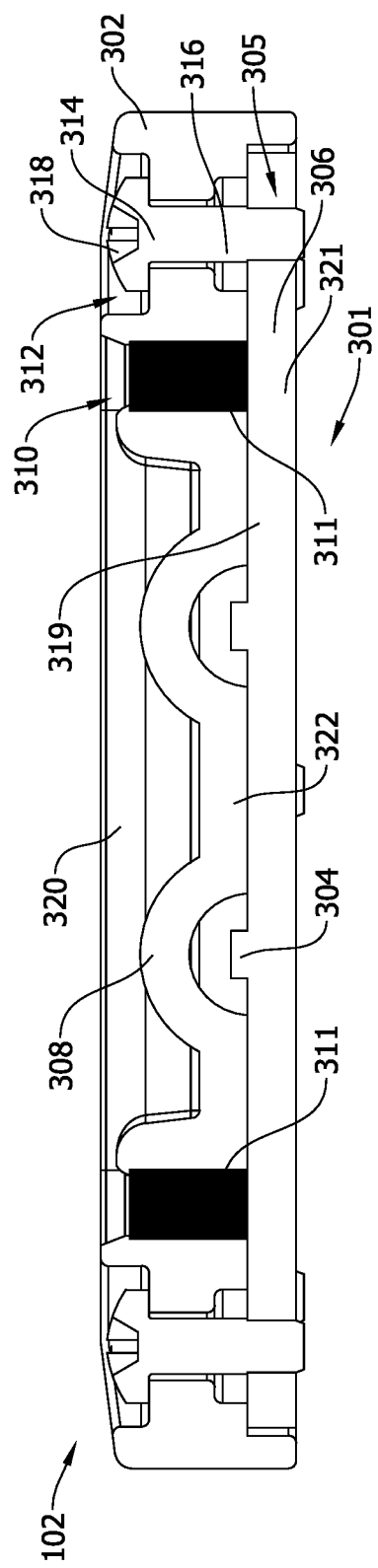
FIG. 3B is a cross-sectional view of the LED module shown in FIG. 3A along line 3B-3B.

FIGS. 3A and 3B show an exemplary embodiment of the LED module 102. FIG. 3A is a top view of the LED module 102. FIG. 3B is a cross-sectional view of the LED module 102 along line 3B-3B shown in FIG. 3A.

In the exemplary embodiment, the LED module 102 includes an LED assembly 301, a lens assembly 302, and an adhesive sealant 311. The LED assembly 301 includes a plurality of LEDs 304 and a PCB 306, where the plurality of LEDs 304 are positioned on the PCB 306. The PCB 306 has a top 319 and a bottom 321 opposite the top 319. The LEDs 304 are positioned on the top 319 of the PCB 306. The PCB 306 may further include a plurality of apertures 305. The LEDs 304 are configured to emit light when provided with current. The LED module 102 may further include a plurality of fasteners 314 coupling the lens assembly 302 with the PCB 306. Exemplary fasteners 314 are screws or bolts. The fastener 314 has a body 316 and a head 318. The body 316 is sized to be received in the aperture 305 of the PCB 306. Coupling the lens assembly 302 with the LED assembly 301 through the fasteners 314 is illustrated as an example only. The lens assembly 302 may be coupled with the LED assembly 301 through other mechanisms. For example, the lens assembly 302 is coupled with the LED assembly 301 through coupling mechanisms as part of the LED assembly 301, the lens assembly 302, or both such as latches, clamps, or hooks. In another example, the lens assembly 302 is coupled with the LED assembly 301 through the adhesive sealant 311. The LED module 102 may be supplied with electricity through conductors 307 (FIG. 3A).

In the depicted embodiment, the lens assembly 302 may be fabricated in a single piece construction (i.e., a structure having only one unitary or monolithic piece). The lens assembly 302 may be fabricated from plastic materials such as polycarbonate or acrylic material, or silicon-based materials. The lens assembly 302 may be manufactured by molding, extrusion, machining, or 3D printing, for example. The lens assembly 302 may be formed into various desired shapes. The lens assembly 302 includes a top 320 and a bottom 322 opposite the top 320. The lens assembly 302 includes a plurality of lenses 308 distributed in such a way that the lens 308 covers one or more LED 304 and each LED 304 is covered by a lens 308. Each lens 308 reflects, diffuses, and/or refracts light emitted from one of the LEDs 304. Each lens 308 may be in a shape of a spherical dome or a polygon, or other shapes that allow the lens 308 to function as described herein. As shown in FIG. 3A, the lens assembly 302 include two rows of lenses 308 in a total of 30 lenses 308. In further and/or alternative embodiments, the number of rows and the number of the lenses 308 in each row may be higher or lower, however, depending on the design and the power requirement of the LED module 102. The lens assembly 302 forms a groove 310. The groove 310 is shaped into a complete loop 313 that surrounds all of the lenses 308. The area distributed with the LEDs 304 is smaller than the area enclosed by the complete loop 313 such that the LEDs 304 are within the complete loop in the assembled LED module 102. The groove 310 may be segmented. In some embodiments, the groove 310 is not segmented and is formed as one uninterrupted loop. The lens assembly 302 further includes a plurality of apertures 312, sized to receive the fastener 314 therein.

To assemble the LED module 102, the lens assembly 302 is positioned over the PCB 306 with the bottom 322 of the lens assembly 302 facing the top 319 of the PCB 306 and the apertures 312 in the lens assembly 302 aligned with the apertures 305 of the PCB 306. The fastener 314 is then disposed in the apertures 305, 312 and couples the lens assembly 302 with the PCB 306. To meet the standards for a harsh and hazardous environment such as IEC60079-18, the LED module 102 is sealed with the adhesive sealant 311 by depositing the adhesive sealant 311 into the groove 310. The adhesive sealant 311 may be a casting resin based on polyurethane, for example WEVOPUR 403/10. The adhesive sealant 311 has a relatively-high thermal conductivity and is suited for explosion-proof applications, where equipment is safe to operate in a harsh and hazardous environment. For example, the thermal conductivity of the adhesive sealant 311 is 0.6 W/m·K in one example. Because the lens assembly 302 is one piece and covers the LEDs 304 with the groove 310 surrounding the lenses 308, depositing the adhesive sealant 311 in the groove 310 effectively seals the LEDs 304 off from the ambient environment around the LED module 102, preventing fire hazards such as sparks from escaping from the LED module 102 and preventing hazardous substances such as explosive vapors, gases, dust, or fibers or corrosive substances from entering into the LED module 102. In some embodiments, the LED module 102 only includes the LED assembly 301, the lens assembly 302, and the adhesive sealant 311, and fasteners 314, without the performance of the LED module 102 being compromised.

Compared to the known LED module 200, the LED module 102 disclosed herein does not need end caps 216 because the groove 310 forms a complete loop 313. The LED module 102 does not need a heat sink if the power of the LED module 102 does not require a heat sink for dissipating heat. An LED module 102 without a heat sink reduces the cost of the LED module greatly because these aluminum heat sinks are costly for manufacturing the LED lighting fixtures. On the other hand, if a heat sink is desired due to the power of the LED module 102, the heat sink may be attached to the LED module 102 using the fastener 314. For example, the body 316 of the fastener 314 may have a length such that the body 316 extend beyond at least one of the PCB 306 or the lens assembly 302 and be received in an aperture in the heat sink.

In assembling the known LED module 200, three apertures—an aperture 218 of the lens assembly 205, an aperture 220 of the PCB 202, and an aperture 222 of the heat sink 208—need to be aligned up. Further, it is a complicated procedure to pour the adhesive 212 into the channel 214 such that the adhesive 212 would flow into the inner channel 232 of the channel 214 and up into the gap 234 between the heat sink 208 and the lens assembly 205 and seal all potential escaping points and routes. Moreover, more adhesive 212 is needed in the LED module 200 than the LED module 102. The escaping routes are multiple, which includes through the three apertures 218, 220, 222 at multiple locations such as the fastener 210, the channels 214, and the end caps 216. The adhesive 212 needs to be deposited over the fastener 210, in the channels 214, and between the end caps 216 and the lens assembly 205. Because the heat sink 208 and the lens assembly 205 are separate pieces, the channels 214 must extend the entire length of the LED module 200, increasing the amount of the adhesive 212 needed and increasing the possibility of failure when a complete seal is not achieved. Because the heat sink 208, the fastener 210, and the lens assembly 205 may be fabricated from different materials, the adhesive 212 should be chosen such that the adhesive 212 bonds with all of those different materials.

In contrast, the LED module 102 disclosed herein has a lower cost and is more reliable and easier to assemble, compared to the known LED module 200. The LED module 102 includes fewer components than the LED module 200, thereby reducing likelihood of defects in the components themselves and in the coupling between components and increasing the reliability of the LED module 102. In one exemplary embodiment, the LED module 102 is provided as a packaged sub-assembly that only includes the LED assembly 301, the lens assembly 302, and the adhesive sealant 311. In another contemplated embodiment, the LED module 102 may be provided as a sub-assembly including the LED assembly 301, the lens assembly 302, the adhesive sealant 311, and the fasteners 314. In still other contemplated embodiments, the LED modules 102 may be provided with the LED assembly 301, the lens assembly 302, the adhesive sealant 311, and perhaps the fasteners 314 in combination with other components such as conductors 307, known connectors to establish electrical connections, or other desirable features facilitating the assembly of the LED luminaire or other lighting fixture. As such, LED module components may be provided in a kit form as a set of modular components that can be conveniently mixed and matched to meet the needs of different installations or to provide varying features in different luminaires or lighting projects to more or less universally meet the needs of a broad range of installations.

By virtue of the modular component assemblies described above, assembly processes are beneficially simplified for the LED module 102, compared to assembling the known LED module 200, and reliability improvements are realized. In the LED module 102, the only escaping route from the LED module 102 is through the interface between the bottom 322 of the lens assembly 302 and the top 319 of the PCB 306. Sealing at the groove 310 therefore effectively prevent sparks from escaping from the LED module 102 and flammable and/or corrosive substances from entering the LED module 102. The adhesive sealant 311 only needs to bind with the material of which the lens assembly 302 is fabricated. The choices of the adhesive sealant 311, therefore, are wider than the adhesive 212. In addition, the LED module 102 does not restrict the profiles of heat sinks that are to be attached to the LED module 102 if a heat sink is desired, unlike the heat sink 208 of the known LED module 200 where the LED module 200 requires the heat sink 208 having channels 214 and specific profiles for coupling with the lens assembly 205 and the PCB 202 (see FIG. 2B). In one example, the LED module 102 costs as half as the LED module 200 having the same lumen rating, counting the costs of the components. Less components and easiness to assemble the LED module 102 also reduces assembling costs, compared to assembling the LED module 200.

Figure 4:
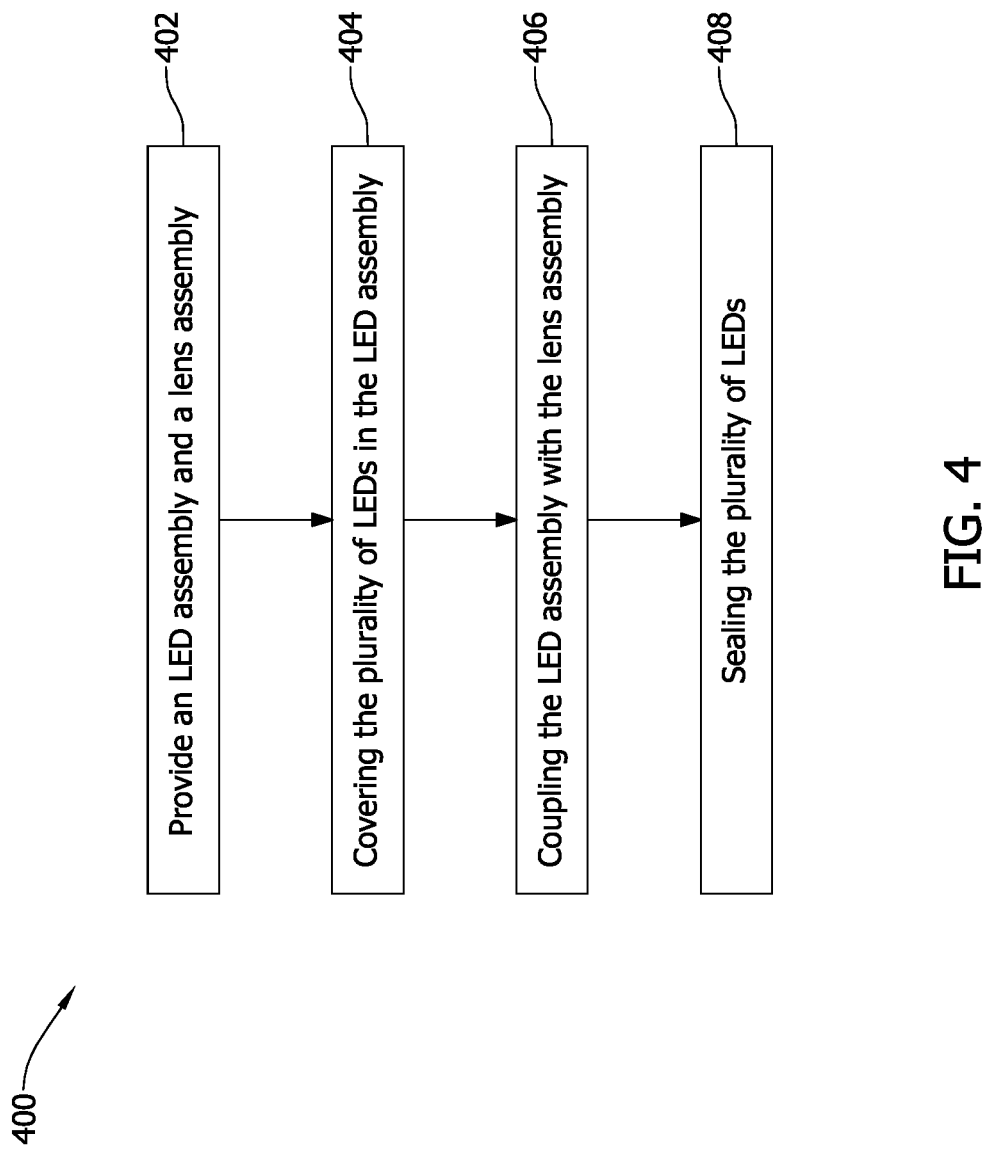
FIG. 4 is a flow chart of an exemplary method of assembling the LED module shown in FIGS. 1, 3A, and 3B.

FIG. 4 is a flow chart of an exemplary method 400 of assembling an LED module such as the LED module 102 described above. In the exemplary embodiment, the method 400 includes providing 402 an LED assembly including a plurality of LEDs and a single-piece lens assembly including a plurality of lenses. The lens assembly includes a groove defining a complete loop and surrounding the plurality of lenses. The method 400 also includes covering 404 the plurality of LEDs with the plurality of lenses. Further, the method 400 includes coupling the LED assembly with the lens assembly. In addition, the method 400 includes sealing the plurality of LEDs from an ambient environment around the LED module by disposing an adhesive sealant in the groove. In one example, the method 400 only includes providing 402 an LED assembly and a single-piece lens assembly, covering 404 the plurality of LEDs, coupling 406 the LED assembly with the lens assembly, and sealing 408 the plurality of LEDs. In another example, the method 400 only includes providing 402 an LED assembly and a single-piece lens assembly, covering 404 the plurality of LEDs, coupling 406 the LED assembly with the lens assembly by fastening a plurality of fasteners with the lens assembly and with the LED assembly, and sealing 408 the plurality of LEDs. In other examples, the method 400 includes providing 402 an LED assembly and a single-piece lens assembly, covering 404 the plurality of LEDs, coupling 406 the LED assembly with the lens assembly, sealing 408 the plurality of LEDs, and other actions such as electrically coupling conductors and connectors with the LED assembly. Considerable variations are possible given the modularity of the components in the assembly that may increase or reduce the number of steps needed to complete the assembly.

At least one technical effect of the systems and methods described herein includes (a) an LED module meeting standards for a harsh and hazardous environment and having a reduced number of components; (b) an LED module of increased reliability and reduced costs in manufacturing and materials from having a reduced number of components, (c) an LED module that does not require a heat sink; (d) an LED module that does not require end caps.

The benefits and advantages of the inventive concepts are now believed to have been amply illustrated in relation to the exemplary embodiments disclosed.

An embodiment of an LED module of an LED luminaire assembly for a harsh and hazardous environment is disclosed. The LED module includes an LED assembly, a single-piece lens assembly, and an adhesive sealant. The LED assembly includes a plurality of LEDs. The single-piece lens assembly includes a plurality of lenses, wherein the lens assembly includes a groove defining a complete loop and surrounding the plurality of lenses, the lens assembly coupled to the LED assembly, and the plurality of lenses covering at least one of the plurality of LEDs. The adhesive sealant is disposed in the groove and bonded to the lens assembly, the adhesive sealant sealing off the plurality of LEDs from an ambient environment around the LED module.

Optionally, the plurality of LEDs are positioned within the complete loop. The lens assembly defines a plurality of apertures positioned outside the complete loop and sized to receive a fastener therein. The LED assembly defines a plurality of apertures positioned outside the complete loop and sized to receive the fastener therein, the plurality of apertures of the LED assembly are aligned with the plurality of apertures of the lens assembly. The LED module further includes a plurality of fasteners positioned in the plurality of apertures of the LED assembly and the plurality of apertures of the lens assembly and coupling the LED assembly with the lens assembly, wherein at least one of the plurality of fasteners extends beyond at least one of the LED assembly or the lens assembly and is sized to be received in an aperture of a heat sink. The LED module does not include a heat sink. The LED module does not include an end cap positioned at an end of the lens assembly.

An embodiment of a method of assembling an LED module of an LED luminaire assembly for a harsh and hazardous environment is disclosed. The method includes providing an LED assembly including a plurality of LEDs and a single-piece lens assembly including a plurality of lenses, wherein the lens assembly includes a groove defining a complete loop and surrounding the plurality of lenses. The method also includes covering the plurality of LEDs with the plurality of lenses, coupling the LED assembly with the lens assembly, and sealing the plurality of LEDs from an ambient environment around the LED module by disposing an adhesive sealant in the groove.

Optionally, the plurality of LEDs are distributed in an area smaller than an area enclosed by the complete loop, and covering the plurality of LEDs further includes positioning the plurality of LEDs to be within the complete loop. The lens assembly defines a plurality of apertures positioned outside the complete loop and sized to receive a fastener therein. The LED assembly defines a plurality of apertures positioned outside an area that is distributed with the plurality of LEDs and is smaller than an area enclosed by the complete loop, the plurality of apertures of the LED assembly sized to receive the fastener therein. Coupling the LED assembly further includes aligning one of the plurality of apertures of the LED assembly with one of the plurality of apertures of the lens assembly and fastening the fastener into the aperture of the LED assembly and the aperture of the lens assembly. The method further includes coupling a heat sink with the LED assembly and the lens assembly by fastening the fastener into the aperture of the LED assembly, the aperture of the lens assembly, and an aperture of the heat sink. The LED module does not include a heat sink. The LED module does not include an end cap positioned at an end of the lens assembly.

Another embodiment of an LED module of an LED luminaire assembly for a harsh and hazardous environment is disclosed. The LED module consists of an LED assembly including a plurality of LEDs, a single-piece lens assembly, an adhesive sealant, and a plurality of fasteners. The single-piece lens assembly includes a plurality of lenses, wherein the lens assembly includes a groove defining a complete loop and surrounding the plurality of lenses, the lens assembly coupled to the LED assembly, and the plurality of lenses covering at least one of the plurality of LEDs. The adhesive sealant is disposed in the groove and bonded to the lens assembly, the adhesive sealant sealing off the plurality of LEDs from an ambient environment around the LED module. The plurality of fasteners couple the LED assembly with the lens assembly.

Optionally, the plurality of LEDs are positioned within the complete loop. The lens assembly defines a plurality of apertures positioned outside the complete loop and sized to receive one of the plurality of fasteners therein. The LED assembly defines a plurality of apertures positioned outside the complete loop and sized to receive the fastener therein. The plurality of fasteners are positioned in the plurality of apertures of the LED assembly and the plurality of apertures of the lens assembly and couple the LED assembly with the lens assembly. The LED module consists of the LED assembly, the single-piece lens assembly coupled with the LED assembly, and the adhesive sealant.

While exemplary embodiments of components, assemblies and systems are described, variations of the components, assemblies and systems are possible to achieve similar advantages and effects. Specifically, the shape and the geometry of the components and assemblies, and the relative locations of the components in the assembly, may be varied from that described and depicted without departing from inventive concepts described. Also, in certain embodiments, certain components in the assemblies described may be omitted to accommodate particular types of fuses or the needs of particular installations, while still providing the needed performance and functionality of the fuses.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A light-emitting diode (LED) module of an LED luminaire assembly containing one or more modular components for a harsh and hazardous environment, comprising:
   an LED assembly comprising a plurality of LEDs;
   a single-piece lens assembly comprising a plurality of lenses, wherein the lens assembly comprises a groove that extends vertically from a print circuit board to an opening for receiving an adhesive sealant and defines a complete loop that surrounds the plurality of lenses, the lens assembly coupled to the LED assembly, and the plurality of lenses covering at least one of the plurality of LEDs;
   and
   an adhesive sealant disposed in the groove and bonded to the lens assembly, the adhesive sealant sealing off the plurality of LEDs from an ambient environment around the LED module.

2. The LED module of claim 1, wherein the plurality of LEDs are positioned within the complete loop.

3. The LED module of claim 1, wherein the lens assembly defines a first plurality of apertures positioned outside the complete loop and sized to receive a fastener therein.

4. The LED module of claim 3, wherein the LED assembly defines a second plurality of apertures positioned outside the complete loop and sized to receive the fastener therein, wherein each aperture of the second plurality of apertures of the LED assembly are aligned with a respective aperture of the first plurality of apertures of the lens assembly.

5. The LED module of claim 4, further comprising a plurality of fasteners positioned in the first plurality of apertures of the LED assembly and the second plurality of apertures of the lens assembly, the plurality of fasteners coupling the LED assembly with the lens assembly, wherein at least one of the plurality of fasteners extends beyond at least one of the LED assembly or the lens assembly and is sized to be received in an aperture of a heat sink.

6. The LED module of claim 1, wherein the LED module does not include an end cap positioned at an end of the lens assembly.

7. The LED module of claim 1, wherein the LED module does not include a heat sink.

8. A light-emitting diode (LED) module of an LED luminaire assembly containing one or more modular components for a harsh and hazardous environment, consisting of:
   an LED assembly comprising a plurality of LEDs;
   a single-piece lens assembly comprising a plurality of lenses, wherein the lens assembly comprises a groove that extends vertically from a print circuit board to an opening for receiving an adhesive sealant and defines a complete loop that surrounds the plurality of lenses, the lens assembly coupled to the LED assembly, and the plurality of lenses covering at least one of the plurality of LEDs;
   and
   an adhesive sealant disposed in the groove and bonded to the lens assembly, the adhesive sealant sealing off the plurality of LEDs from an ambient environment around the LED module.

9. The LED module of claim 8, wherein the plurality of LEDs are positioned within the complete loop.

10. The LED module of claim 8, wherein the lens assembly defines a first plurality of apertures positioned outside the complete loop and sized to receive a fastener therein.

11. The LED module of claim 10, wherein the LED assembly defines a second plurality of apertures positioned outside the complete loop and sized to receive a fastener therein, wherein each aperture of the second plurality of apertures of the LED assembly are aligned with a respective aperture of the first plurality of apertures of the lens assembly.

12. The LED module of claim 11, wherein the fastener is positioned in the first plurality of apertures and the second plurality of apertures and couple the LED assembly with the lens assembly.

13. The LED module of claim 12, wherein the fastener is positioned in the second plurality of apertures of the LED assembly and the plurality of apertures of the lens assembly and couple the LED assembly with the lens assembly.

14. A method of assembling a light-emitting diode (LED) module of an LED luminaire assembly containing one or more modular components for a harsh and hazardous environment, comprising:

provides an LED assembly including a plurality of LEDs, and a single-piece lens assembly including a plurality of lenses, wherein the lens assembly includes a groove a complete loop that surrounds the plurality of lenses;

covering the plurality of LEDs with the plurality of lenses;

coupling the LED assembly with the lens assembly; and sealing the plurality of LEDs from an ambient environment around the LED module by disposing an adhesive sealant in the groove.

15. The method of claim 14, wherein the plurality of LEDs are distributed in an area smaller than an area enclosed by the complete loop, and covering the plurality of LEDs further comprises positioning the plurality of LEDs to be within the complete loop.

16. The method of claim 14, wherein the lens assembly defines a first plurality of apertures positioned outside the complete loop and sized to receive a fastener therein.

17. The method of claim 16, wherein the LED assembly defines a second plurality of apertures positioned outside an area that is distributed with the plurality of LEDs and is smaller than an area enclosed by the complete loop, the plurality of apertures of the LED assembly sized to receive the fastener therein, and coupling the LED assembly further comprising:

aligning one of the plurality of apertures of the LED assembly with one of the plurality of apertures of the lens assembly; and fastening the fastener into the one of the first plurality of apertures of the LED assembly and one of the plurality of apertures of the lens assembly.

18. The method of claim 17, further comprising:

coupling the heat sink with the LED assembly and the lens assembly by fastening the fastener into the one of the plurality of apertures of the LED assembly, one of the plurality of apertures of the lens assembly, and an aperture of the heat sink.

19. The method of claim 14, wherein the LED module does not include an end cap positioned at an end of the lens assembly.

20. The method of claim 14, wherein the LED module does not include a heat sink.

* * * * *